US009601264B2

(12) United States Patent
Kim et al.

(10) Patent No.: US 9,601,264 B2
(45) Date of Patent: Mar. 21, 2017

(54) RESONANCE TERMINAL DEVICE FOR RESONANT WIRELESS POWER RECEPTION SYSTEM

(71) Applicant: Samsung Electronics Co., Ltd., Gyeonggi-do (KR)

(72) Inventors: Joon-Il Kim, Seoul (KR); Se-Ho Park, Gyeonggi-do (KR); Sung-Ku Yeo, Daejeon (KR); Woo-Ram Lee, Gyeonggi-do (KR); Jeong-Seok Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 520 days.

(21) Appl. No.: 13/875,732

(22) Filed: May 2, 2013

(65) Prior Publication Data
US 2013/0293027 A1  Nov. 7, 2013

(30) Foreign Application Priority Data

May 2, 2012  (KR) .................. 10-2012-0046232
Mar. 29, 2013  (KR) .................. 10-2013-0034640

(51) Int. Cl.
*H02J 17/00* (2006.01)
*H01F 38/14* (2006.01)
*H02J 50/12* (2016.01)
*H02J 5/00* (2016.01)
*H04B 5/00* (2006.01)

(52) U.S. Cl.
CPC .............. *H01F 38/14* (2013.01); *H02J 5/005* (2013.01); *H02J 50/12* (2016.02); *H04B 5/0037* (2013.01); *H04M 2250/04* (2013.01)

(58) Field of Classification Search
CPC ...... H01F 38/14; H04M 2250/04; H02J 50/12
See application file for complete search history.

(56) References Cited

U.S. PATENT DOCUMENTS

2010/0140671 A1* 6/2010 Nojima ............. H01L 27/10823
257/255
2011/0009057 A1* 1/2011 Saunamaki ............. H02J 7/025
455/41.1
2013/0009488 A1* 1/2013 Choe ....................... H02J 5/005
307/104
2013/0077361 A1* 3/2013 Low et al. ...................... 363/48

FOREIGN PATENT DOCUMENTS

KR  1020100047779  5/2010

* cited by examiner

*Primary Examiner* — Daniel Cavallari
(74) *Attorney, Agent, or Firm* — The Farrell Law Firm, P.C.

(57) ABSTRACT

A shunt capacitor is connected to a wireless charging resonator to prevent harmonics emitted from a power amplifier from radiating to the outside, and at least one circuit having a high impedance relative to a Near Field Wireless Communication (NFC) frequency band is formed at a front side or a rear side of the shunt capacitor for solving the problems of radiating noise components due to wireless charging and of lowering an NFC signal and a power transmission intensity due to a concurrent interference between a wireless charging resonator and an NFC antenna.

4 Claims, 4 Drawing Sheets

RESONANCE TERMINAL DEVICE FOR RESONANT WIRELESS POWER RECEPTION SYSTEM

PRIORITY

This application claims priority under 35 U.S.C. §119(a) to Korean Application Serial No. 10-20120-0046232, which was filed in the Korean Intellectual Property Office on May 2, 2012 and Korean Application Serial No. 10-2013-0034640, which was filed in the Korean Intellectual Property Office on Mar. 29, 2013, the contents of both of which are incorporated herein by reference.

BACKGROUND OF THE INVENTION

1. Field of the Invention

The present invention relates generally to a wireless power transmission technology applied to wireless charging, and more particularly, to a resonance terminal device for reducing electromagnetic interferences with an antenna for Near Field Communication (NFC) in a reception system of a resonant Wireless Power Transmission (WPT) technology.

2. Description of the Related Art

In recent years, wireless charging (or noncontact charging) technologies using wireless power transmission have been developed and utilized in many electronic devices. One of the wireless charging technologies is a system by which a battery is automatically charged, for example, only by positioning the battery on a charging deck without connecting the mobile phone to a charging connector.

The WPT technologies largely include an electromagnetic induction method using coils, a resonance method using resonances, and a Radio Frequency (RF)/microwave radiation method for converting electrical energy into microwaves to transfer the electrical energy. In the power transmission method using electromagnetic induction, electric power is transmitted between a primary coil of a transmission unit and a secondary coil of a reception unit. The resonance method utilizes frequency resonances between a transmission unit and a reception unit using a resonance frequency. The wireless power transmission technology using resonance is applied to the present invention.

Studies on the WPT technology for wireless charging of portable terminals are currently underway. That is, a portable terminal includes a detachable or embedded battery pack, and commercialization of techniques for a convenient wireless charging function using the wireless power transmission technology are being developed.

Traffic cards, security cards for verifying incoming and outgoing people, and credit cards make transactions or are user-verified by using NFCs, and the NFC function is also mounted to portable terminals. Thus, a portable terminal includes a separate antenna for performing the NFC function. The NFC technology is disclosed in Korean Unexamined Patent Publication No. 2009-126323 (published on Dec. 8, 2009).

In order to mount the NFC function and a wireless charging function to one terminal, an NFC antenna having a generally loop-shaped antenna structure and a resonator for wireless charging should be mounted to the terminal. However, problems arise from interferences between the NFC antenna and the WPT resonator.

SUMMARY OF THE INVENTION

An aspect of the present invention is to provide a resonance terminal device for a resonant wireless power transmission system, for solving the problems of radiating noise components due to wireless charging and of lowering an NFC signal and a power transmission intensity due to a concurrent interference between a wireless charging resonator and an NFC antenna, when the wireless charging resonator and a circuit are realized.

In order to achieve the object of the present invention, a shunt capacitor is connected to a wireless charging resonator to prevent harmonics emitted from a Power Amplifier (PA) from radiating to the outside, which satisfies ENG (negative $\epsilon$) and MNG (negative $\mu$) conditions to allow for a ZOR (Zero Order Resonance) as shown in FIG. 5. The circuit prevents signals or electric power other than resonant wireless charging frequencies from being discharged to the outside. At least one circuit having a high impedance relative to an NFC frequency band (13.56 MHz) is formed at a front side or a rear side of the shunt capacitor.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Figure 1:
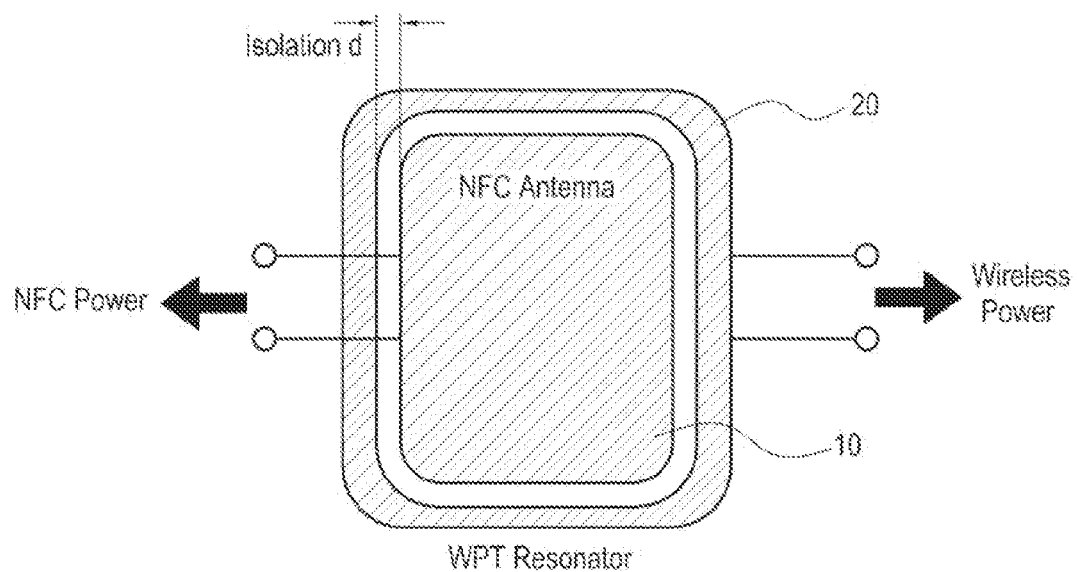
FIG. 1 illustrates a planar disposition structure of an NFC antenna and a WPT resonator for a resonant wireless power reception system according to the present invention.

Hereinafter, various embodiments of the present invention will be described in detail with reference to the accompanying drawings. In the following description, the same elements will be designated by the same reference numerals although they are shown in different drawings. A detailed description of known functions and configurations incorporated herein will be omitted for the sake of clarity and conciseness.

Figure 2:
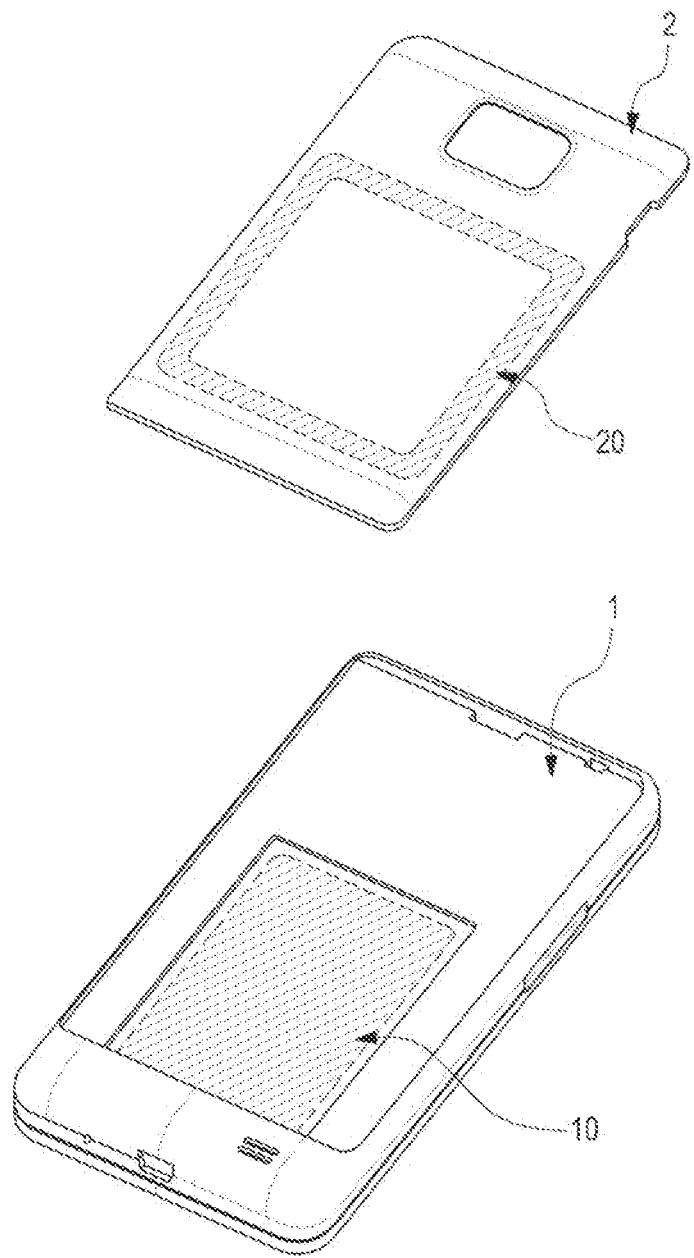
FIG. 2 illustrates a disposition of an NFC antenna and a WPT resonator for a resonant wireless power reception system according to the present invention on a portable terminal.
Figure 3:
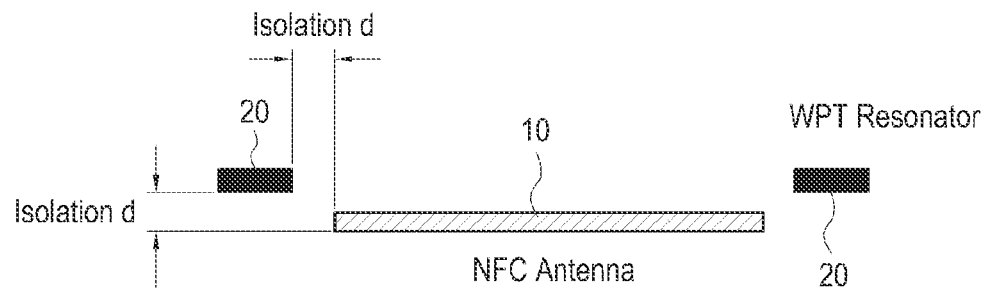
FIG. 3 illustrates a lateral disposition of the NFC antenna and the WPT resonator of FIG. 2.

FIG. 1 illustrates a planar disposition structure of an NFC antenna and a WPT resonator for a resonant wireless power reception system according to the present invention. FIG. 2 illustrates a disposition of an NFC antenna and a WPT resonator for a resonant wireless power reception system according to the present invention on a portable terminal. FIG. 3 illustrates a lateral disposition of the NFC antenna and the WPT resonator of FIG. 2.

Referring to FIGS. 1 to 3, a mechanical mounting state of an NFC antenna 10 and a WPT resonator 20 in a wireless power reception system, that is, a portable terminal according to the present invention will initially be described. In a plan view, the NFC antenna 10 having a loop-shaped antenna structure may be located inside the WPT resonator 20 also having a loop-shaped antenna structure. The NFC antenna 10 may be installed on a rear surface of a body 1 of the portable terminal (at a portion of a detachable battery), and the WPT antenna 20 may be installed on a rear cover 2 of the portable terminal.

Then, as illustrated in FIG. 3, isolation distances (isolation d and isolation h) are properly designed between the NFC antenna 10 and the WPT resonator 20 to secure isolation characteristics. Due to the isolation distances, the isolation characteristics of two frequencies 13.56 MHz and 6.78 MHz of the NFC antenna 10 and the WPT resonator are mechanically determined. Although the NFC antenna 10 should be designed to be small and the WPT resonator 20 should be designed to be large in order to adjust the isolation distances to secure the isolation characteristics, this method can be applied in a very limited manner to a design-sensitive terminal such as a portable terminal due to the mounting areas and locations of the NFC antenna 10 and the WPT resonator 20.

Figure 4:
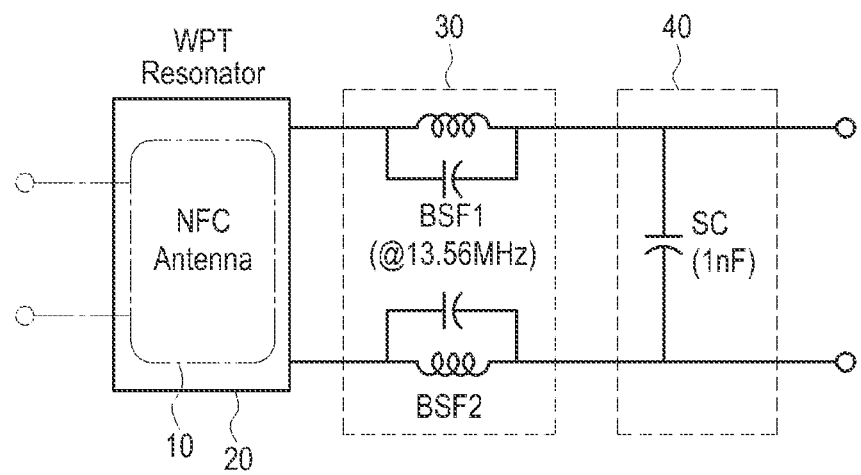
FIG. 4 is a circuit diagram of a resonance terminal device in a resonant wireless power reception system according to an embodiment of the present invention.
Figure 5A:
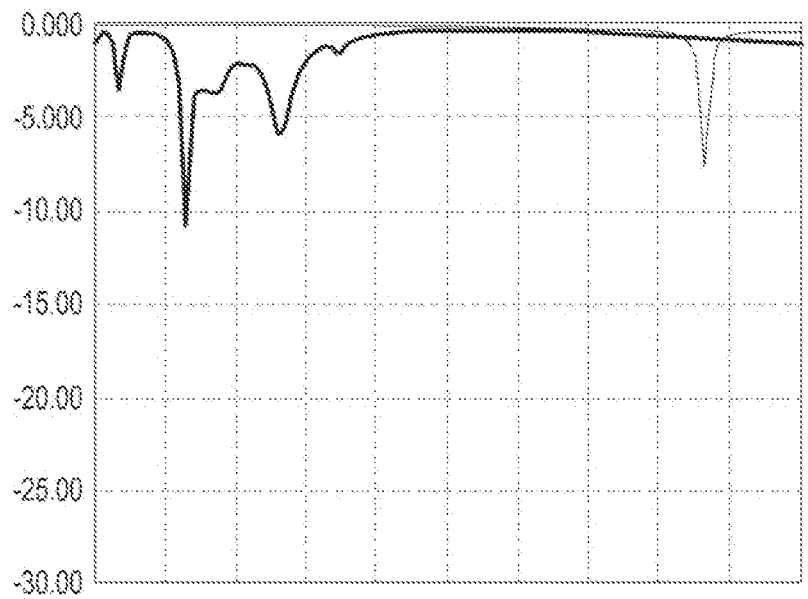
FIGS. 5A and 5B illustrate characteristic wave diagrams of the resonance terminal device in the resonant wireless power reception system.
Figure 5B:
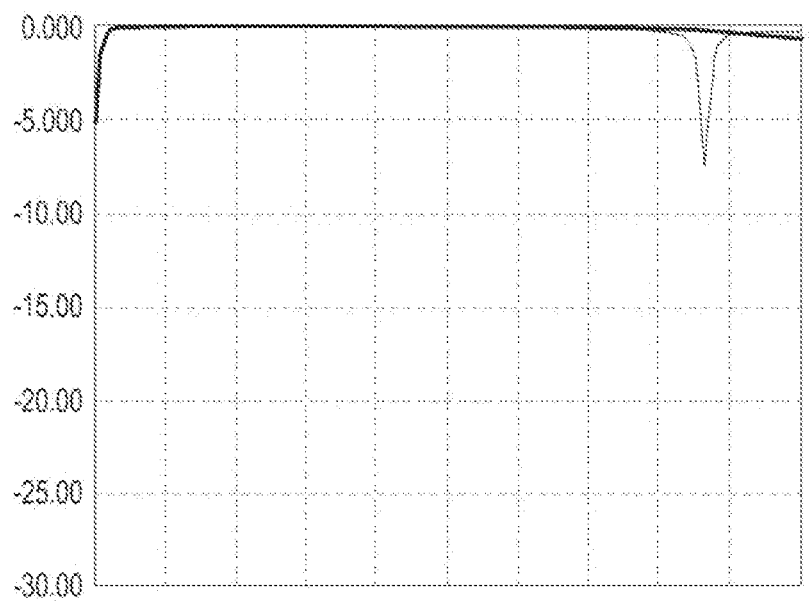

FIG. 4 is a circuit diagram of a resonance terminal device in a resonant wireless power reception system according to an embodiment of the present invention. Referring to FIG. 4, a shunt capacitor 40 is connected to the WPT resonator 20 to prevent harmonics emitted from a WPT Power Amplifier (PA, not shown) from being radiated to the outside. This achieves a ZOR as shown in FIG. 5B, by concurrently satisfying the ENG and MNG conditions. The circuit prevents signals or electric power other than the resonant wireless charging frequency from being discharged to the outside.

Specifically, in generally designing the WPT resonator 20 of 6.78 MHz or 13.56 MHz, for example, a method of using a meta structure may be used to eliminate the harmonic radiation characteristics generated by an electrical length of the WPT resonator 20. This may be useful in increasing multiples of harmonics due to the short electric length, but cannot completely eliminate harmonics. Thus, it was confirmed as shown in FIG. 5A that the harmonic radiation characteristics are shown in 20 harmonics or 40 harmonics according to the design of the resonator. This structure could not achieve a perfect ZOR resonance.

The ZOR resonance should be achieved to supplement the harmonic radiation characteristics, and the EMI (Electro-Magnetic Interference) is eliminated or reduced by using the shunt capacitor 40 provided in the WPT resonator 20 and having a capacity of a preset value between two terminals, for example, 100 pF, and preferably 1 nF according to the present invention.

However, as shown in FIGS. 1 to 3, when the circuit using the shunt capacitor 40 according to the present invention is realized, the NFC communication signals or electric power may be coupled to the WPT resonator 20 to be leaked through the wireless charging path in the mechanical structure where the NFC antenna 10 is disposed inside the WPT resonator 20. The problem is caused as the interval between the WPT resonator 20 and the NFC antenna 10 is very small due to the portable terminal characteristics. That is, although the shunt capacitor 40 having a capacity or higher is provided in the WPT resonator 20 in the present invention to achieve the ZOR resonance and accordingly supplement the harmonic radiation characteristics of the WPT resonator 20, the signals and electric power received from the NFC antenna mounted to the terminal are grounded through the RF path and its signals and electric power may be coupled through the WPT resonator 20 when the interval between the NFC antenna 10 and the WPT resonator 20 is narrow.

Thus, according to the present invention, since a circuit having a high impedance at a frequency band (13.56 MHz) for NFC is designed in the WPT resonator 20, signals connected to the WPT resonator 20, and the power transmission path, a phenomenon of leaking signals and electric power transmitted and received to and from the NFC antenna through the wireless charging resonator is overcome.

That is, as described with reference to FIGS. 1 to 3, although the NFC antenna 10 should be designed to be small and the WPT resonator 20 should be designed to be large in order to adjust the isolation distances to secure the isolation characteristics, this method can be applied in a very limited manner to a design-sensitive terminal such as a portable terminal due to the mounting areas and locations of the NFC antenna 10 and the WPT resonator 20.

Thus, a high impedance circuit 30 having a high impedance (such as 10 Ohm) relative to the NFC frequency band (13.56 MHz) is formed in at least one of the two terminals of the resonator, at a front or rear side of the shunt capacitor 40, in order to secure electrical isolations of the two frequencies (13.56 MHz and 6.78 MHz) of the NFC antenna 10 and the WPT resonator 20 without applying a mechanical structure. The high impedance circuit 30 is realized by a BSF (Band Stop Filter) structure for the NFC frequency band (13.56 MHz).

Due to the configuration, in the resonance terminal device according to the present invention, the capacitor 40 is connected to both terminals of the WPT resonator 20 to restrain harmonic radiation components of the WPT resonator 20, thereby achieving a ZOR resonance as shown in FIG. 5B. Since the high impedance circuit 30 having a high impedance at the NFC frequency (13.56 MHz) on the wireless charging path is formed, the NFC signals and electric power generated by the small isolation distance between the NFC antenna 10 and the WPT resonator 20 are restrained from being leaked through the wireless charging path.

As described above, the resonance terminal device for a resonant wireless power reception system according to the present invention solves the problems of radiating noise components due to wireless charging and of lowering an NFC signal and a power transmission intensity due to a concurrent interference between a wireless charging resonator and an NFC antenna, when the wireless charging resonator and a circuit are realized.

As described above, the resonance terminal device can be configured and operated in the resonant wireless power reception system according to the embodiment of the present invention. Although embodiments of the present invention have been described above, the present invention can be variously modified and changed. Although it has been described that both the shut capacitor 40 for improvement of EMI characteristics and the impedance circuit 30 for improvement of NFC characteristics are provided in an embodiment of the present invention, only one of them may be provided in another embodiment of the present invention. That is, only the shut capacitor 40 may be provided, considering only improvement of EMI characteristics, and only the high impedance circuit 30 may be provided, considering only improvement of NFC characteristics.

In addition, although it has been described that the high impedance circuit 30 having the BSF structure are applied to both the terminals of the WPT resonator 20 as BSF1 and BSF2, the high impedance circuit 30 having the BSF structure may be realized only in one of the two terminals. Although it has been described that the high impedance circuit 30 is provided at the front side of the shunt capacitor 40, it may also be provided at the rear side of the shunt capacitor 40.

Furthermore, although it has been described that the NFC antenna 10 is disposed inside the WPT resonator 20 mechanically, the present invention can be applied to a structure where the WPT resonator is disposed inside the NFC antenna.

While the invention has been shown and described with reference to certain embodiments thereof, it will be understood by those skilled in the art that various changes in form and details may be made therein without departing from the spirit and scope of the invention as defined by the appended claims.

What is claimed is:

1. A resonant wireless power reception apparatus, comprising:
    a Near Field wireless Communication (NFC) antenna for performing an NFC function through an NFC frequency band; and
    a resonator for receiving a resonant wireless power using a resonance frequency different from the NFC frequency band, wherein the resonator is installed adjacent to the NFC antenna;
    a shunt capacitor connected to the resonator; and
    a high impedance circuit for filtering a signal having the NFC frequency band provided from the NFC antenna, wherein the high impedance circuit is connected to the shunt capacitor.

2. The resonant wireless power reception apparatus of claim 1, wherein the high impedance circuit is installed at a front side or a rear side of the shunt capacitor which is connected between two terminals of the resonator and has a preset capacity.

3. The resonant wireless power reception apparatus of claim 2, wherein the high impedance circuit comprises a Band Stop Filter (BSF), and the BSF is applied to both terminals of the resonator.

4. The resonant wireless power reception apparatus of claim 1, wherein the NFC antenna is mechanically disposed inside the resonator.

* * * * *